Dec. 19, 1961 R. R. WEBSTER 3,014,186

TUNED TRANSISTOR AMPLIFIER WITH FREQUENCY AND BANDWITH STABILIZATION

Filed Jan. 10, 1956

INVENTOR

Roger R. Webster

BY Stevens, Davis, Miller & Mosher

ATTORNEYS 3,014,186

TUNED TRANSISTOR AMPLIFIER WITH FREQUENCY AND BANDWIDTH STABILIZATION

Roger R. Webster, Dallas, Tex., assignor to Texas Instruments Incorporated, Dallas, Tex., a corporation of Delaware Filed Jan. 10, 1956, Ser. No. 558,355
6 Claims. (Cl. 330—24)

Figure 1:
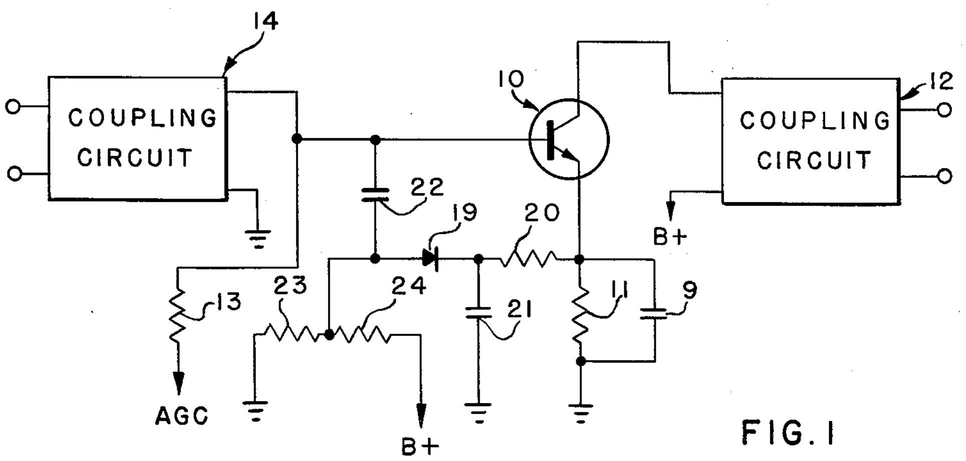

This invention relates to transistor circuits and more particularly to an automatic gain controlled transistor radio frequency amplifier circuit exhibiting constant bandpass characteristics.

It is now well recognized that, although the circuit behavior of transistors and vacuum-tubes is quite similar in many respects, the triode transistor is by no means fully analogous in its behavior to the conventional vacuum-tube. Many of the unique problems in transistor circuit design not encountered in vacuum-tube circuit design have their origins in the coupling effect between the output and input circuits of the transistor, the relatively low input impedance of the device as compared with its output impedance and the fact that a transistor is primarily a current operated, rather than a voltage operated, device.

The above mentioned characteristics of transistors give rise to a problem in providing automatic gain control in a transistor cascade amplifier where the automatic gain control action is obtained by changing a D.-C. bias voltage to one or more of the amplifier stages in accordance with the output level of some later stage. The automatic gain control voltage superimposed on the normal D.-C. bias of the transistor affects the gain of the stage in two distinct ways. First, the gain of the transistor is directly dependent upon its D.-C. bias currents and any change in these bias currents changes the gain. Secondly, changes in the bias currents of the transistor produce changes in both the resistive and reactive components of its input impedance causing impedance mismatches between the transistor input and the preceding stage. These impedance mismatches lower the gain of the stages affected but they also have the effect of de-tuning and unloading the interstage coupling circuits so that both the tuning and bandpass characteristic of the amplifier becomes a function of the automatic gain control applied or, in effect, a function of the input signal strength. Tuning or bandpass characteristics which vary with the input signal strength or with automatic gain control voltage are quite undesirable in amplifiers for a great many applications.

Accordingly, it is the principal object of the present invention to provide a transistor amplifier circuit for use at radio frequencies in which the tuning and bandwidth remains substantially constant over a wide range of automatic gain control voltages.

It is a further object of the present invention to provide a new transistor amplifier circuit for use in cascade amplifiers and other arrangements wherein the automatic gain control range is greatly extended over the control range of other known transistor amplifier circuits for a given bandwidth characteristic.

It is a still further object of the present invention to provide a transistor amplifier circuit in which the input impedance changes produced by automatic gain control are minimized.

Figure 2:
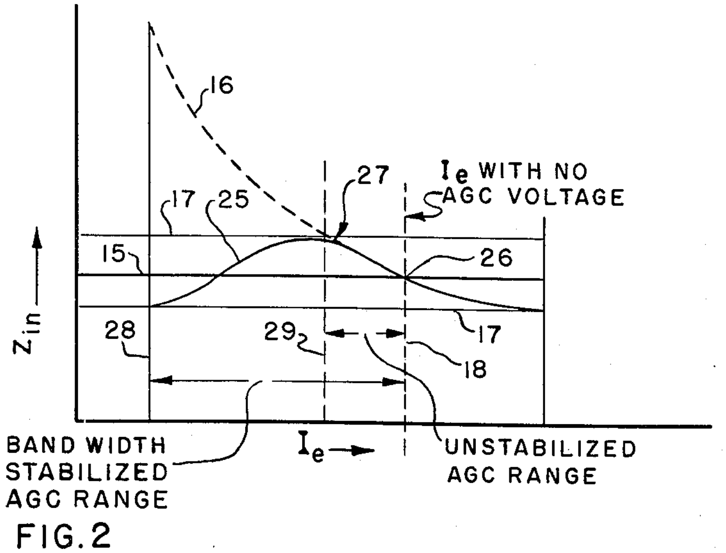

These and other objects of the present invention will become more fully apparent from the following detailed description and the accompanying drawing in which:

FIGURE 1 is a partial schematic of a bandwidth stabilized transistor amplifier circuit showing the preferred embodiment of the present invention; and FIGURE 2 is a graphical chart showing the typical manner in which transistor input impedance varies with changes in emitter current for both an ordinary transistor amplifier and the bandwidth stabilized transistor amplifier of the present invention.

With reference now to FIGURE 1, there is illustrated by partial schematic diagram a typical n-p-n transistor amplifier automatic gain controlled stage comprising the transistor 10 with its emitter connected to ground through the emitter bias resistor 11, its collector connected to B+ voltage and to an impedance matching network 12 coupling the output signal of the circuit to the next stage and its base connected through the resistor 13 to an automatic gain control voltage derived from the output signal of a later stage of the amplifier. The usual A.-C. bypass capacitor 9 is connected across the emitter resistor 11. The input signal is fed to the base of the transistor 10 from the preceding stage of the amplifier through the impedance matching and coupling circuit 14. The amplifier circuit, as thus far described, constitutes the essential parts commonly used in a transistor amplifier stage. The two coupling circuits designated generally as 12 and 14 may be of any of the many interstage impedance matching networks well-known in the art such as, for example, double or single tuned transformers or T or $\pi$ networks of the inductance coupled, capacitance coupled, or inductance and capacitance coupled types, tuned to the operating frequency and designed and adjusted for impedance match between the stages coupled. Since the coupling circuit is a reactance circuit, it is designed to have a certain desired bandpass characteristic when adjusted or tuned to match the input impedance of the transistor with which it is to be used. Because there is a unique adjustment of the coupling circuit for impedance match for each set of transistor bias conditions, that is, the adjustment can produce impedance match for only one transistor bias condition, adjustment of the coupling circuit is usually made for impedance match at some optimum bias condition of the transistor. However, to control the gain of the amplifier stage automatically, one of the D.-C. bias currents must be changed and a change in any of these bias currents produces a change in both resistive and reactive components of the input impedance of the transistor. The impedance mismatch thus produced between the transistor input and the coupling circuit results in a different loading effect on the coupling circuit and the preceding stage and, consequently, an undesirable change in the amplifier bandpass characteristic. Further, the reactance change may result in serious detuning in addition to the changed bandpass characteristics.

The automatic gain control is accomplished in the circuit illustrated in FIGURE 1 by varying the D.C. bias current flowing in the emitter-base circuit through changes in the base bias voltage of the transistor derived from the output signal level from some later stage in the amplifier and fed to the transistor base terminal through the resistor 13. The effects of the changes in the emitter current of a transistor on the input impedance of the transistor are shown in the graph of FIGURE 2 which is a plot of input impedance against emitter current for an n-p-n grounded emitter transistor circuit of the type shown in FIGURE 1. On the graph, the horizontal line 15 represents the input impedance of the transistor when the D.C. bias currents are adjusted for optimum performance of the circuit. The input coupling circuit of the transistor is designed to have the desired bandwidth when "looking into" this value of impedance. The curve 16 represents the changes in the resistive component of transistor input impedance as the emitter current is varied by the automatic gain control voltage. The lines 17 define an input impedance of the transistor 15% to either side of the design center impedance and the limits within which the bandwidth will not change more than approximately 7½% with a double tuned input coupling circuit such as was used in testing the circuit. It is to be understood that the above mentioned specific values were arbitrarily chosen for illustrative purposes only and that the present invention is in no way limited thereto. Thus, it can be seen that the automatic gain control voltages of the stage must be held within the range in which the emitter currents produced by them do not effect an input impedance change of more than 15% of the design center impedance if objectional changes in the bandwidth characteristic of more than the arbitrarily chosen 7½% are to be avoided. This emitter current range is defined on the graph of FIGURE 2 between the line 18, the emitter current with no automatic gain control voltage applied, and the line 29, the emitter current producing a 15% change in input impedance. In terms of gain, this range is only a few db.

Returning now to FIGURE 1, it can be seen that the transistor amplifier circuit of the present invention has, in addition to the usual amplifier components, a diode element 19 with its cathode connected to the emitter of the transistor 10 through the resistor 20 and to ground through the capacitor 21 and its anode connected to the base of the transistor 10 through the capacitor 22 and to the junction of the resistors 23 and 24. The capacitors 9 and 22 are of such a value that no appreciable impedance is presented at the frequency to be amplified. Thus, when the diode 19 is conductive, the impedance "seen" by the coupling circuit 14 is made up of two parallel paths, one through the transistor itself from base through emitter to ground and the other from the base lead of the transistor through diode 19 and capacitor 21 in parallel with resistor 20 to ground. When the diode 19 is non-conductive, the circuit input impedance is the input impedance of the transistor only. By choosing the values of resistors 23 and 24, which form a voltage divider network between B+ voltage and ground, such that the voltage at their junction point and therefore the voltage on the anode of the diode 19 is slightly less than the D.C. voltage at the emitter of the transistor, the diode is biased to a non-conductive state. The diode will remain non-conductive until the automatic gain control voltage to the base of the transistor reduces the emitter bias current to the point where the voltage drop across the resistor 11, which determines the voltage on the transistor emitter and the diode cathode, has decreased to a value less positive than the voltage at the anode of the diode. At this voltage, the diode becomes conductive and the input impedance of the circuit becomes a function of the parallel impedance paths between the base lead and ground as mentioned above. Because the impedance of the diode is a function of the current flowing in it, the input impedance of the amplifier stage will reach a maximum at some value of transistor emitter current and then decrease with a decrease in the emitter current. Since the input impedance of the transistor may consist of both a resistive and a capacitive component, capacitor 21 is proportioned to make the reactance at the input remain effectively constant, thus avoiding detuning with AGC as well as stabilizing bandpass.

The effects of the bandwidth stabilization circuit, just described, on the input impedance of the amplifier stage is shown by curve 25 of FIGURE 2. As can be seen, the curve 25 follows the curve 16 for the emitter current range through which the diode is non-conductive, that is, from normal emitter bias current at 26 down to the emitter bias current producing the arbitrarily chosen maximum impedance change occurring at the point 27. From the point 27, any decrease in the emitter current due, for example, to AGC voltage, produces a forward bias on the diode 19 of FIGURE 1 causing it to become conductive. As indicated by the remaining portion of curve 25, further decreases in the emitter current cause the diode to become more conductive so that the input impedance of the circuit decreases as described in the preceding paragraph. By proper choice of the value of resistor 20 and capacitor 21 of FIGURE 1, the input impedance can be held to within as little as ±15% of the input impedance for which the coupling circuit 14 was designed. In some instances, the resistance of diode 19 is sufficient, and resistor 20 may be replaced by a radio frequency choke coil having high impedance to the operating frequency but providing a D.C. path. The effective stabilizing path at the high frequency is then through diode 19 and capacitor 21. Thus, the automatic gain control range available in the circuit causing less than approximately 7½% bandwidth change, to use the same criterion as in the previous example, has been extended to the line 28, a range of approximately 25 db or an increase in the automatic gain control range of approximately 20 db or more for the stabilized bandwidth circuit over the unstabilized circuit.

Thus, there has been described means for increasing the range of automatic gain control available in transistor amplifier circuits without objectional changes in the tuning or bandwidth characteristic of the amplifier. It is to be understood, of course, that the n-p-n grounded emitter circuit shown is by way of specific example only and that the principles of the bandwidth stabilization system of the present inveniton are applicable as well to circuits using other transistor types such as, for example, p-n-p, p-n-i-p, n-p-i-n and others and to transistor circuit configurations such as grounded base or grounded collector. All of the various changes and modifications suggested above as well as other variations occurring to those skilled in the art are to be considered within the spirit and scope of the present invention and consequently, this invention is to be limited only as set forth in the appended claims.

What is claimed is:

1. In an amplifier, a transistor having an input impedance variable as a function of applied bias and having an emitter electrode, a collector electrode and a base electrode, coupling means for applying input signals to said transistor, said coupling means being connected to the base of said transistor whereby variations in said input impedance are presented to said coupling means, a source of automatic volume control bias variable according to the level of said input signals connected to the base of said transistor for variably biasing said transistor, a resistor connected between the emitter of said transistor and ground for developing a voltage varying in accordance with the bias impressed upon said transistor, whereby said input impedance is varied and the voltage developed across said resistor is correspondingly varied, a source of reference potential, a diode interconnected between said source of reference potential and the emitter of said transistor for sensing when said voltage developed across said resistor is less than a predetermined magnitude, a capacitor connected between the base of said transistor and the end of said diode connected to said source of reference potential, said capacitor and said diode presenting a compensating impedance to said coupling means in parallel with said input impedance of said transistor when said voltage developed across said resistor is less than said predetermined magnitude to maintain the total impedance presented to said coupling means substantially constant.

2. In an amplifier, an amplifying element having an input impedance variable as a function of applied bias and having input and output electrodes, coupling means connected to said input electrode for applying input signals to said input electrode, said coupling means being connected to said amplifying element whereby variations in said input impedance are presented to said coupling means, a source of varying bias connected to said input electrode for variably biasing said amplifying element, and compensating means connected to said coupling means effective when the input impedance of said amplifying means varies with said varying bias for presenting a compensating impedance to said coupling means of such magnitude as to maintain the total impedance presented to said coupling means substantially constant.

3. In an amplifier, a transistor having an input impedance variable as a function of applied bias and having a control electrode, an electron emitter electrode and an electron collector electrode, coupling means for applying input signals to said control electrode, said coupling means being connected to said control electrode whereby variations in said input impedance are presented to said coupling means, a source of automatic volume control bias connected to said control electrode for variably biasing said transistor whereby said input impedance is varied, and compensating means connected to said coupling means and to said control electrode effective when the input impedance of said transistor varies with said automatic volume control bias for presenting a complementary impedance to said coupling means of such magnitude to maintain the total impedance presented to said coupling means substantially constant.

4. In an amplifier, a transistor having an input impedance variable as a function of applied bias and having input and output electrodes and a common electrode, coupling means for applying input signals to said input electrode, said coupling means being connected to said input electrode whereby variations in said input impedance are presented to said coupling means, a source of varying bias for variably biasing said input electrode, an output circuit including said output and common electrodes, a resistor connected in said output circuit for developing a voltage varying in accordance with the bias impressed upon said input electrode whereby said impedance is varied and the voltage developed across said resistor is varied, and compensating means connected to said coupling means to said resistor effective when the voltage developed across said resistor resides at predetermined values for presenting a compensating impedance to said coupling means of such magnitude to maintain the total impedance presented to said coupling means substantially constant.

5. In an amplifier, a transistor having an input impedance variable as a function of applied bias and having input and output electrodes and a common electrode, coupling means for applying input signals to said input electrode, said coupling means being connected to said input electrode whereby variations in said input impedance are presented to said coupling means, a source of automatic volume control bias variable according to the level of said input signals for variably biasing said input electrode, an impedance element connected to said common electrode for developing a voltage varying in accordance with the bias impressed upon said input electrode whereby said input impedance is varied and the voltage developed across said impedance element is correspondingly varied, a source of reference potential, means interconnected between said source of reference potential and the junction of said impedance element and said common electrode for sensing when voltage developed across said impedance element is less than a predetermined magnitude, and means including said last-mentioned means connected to said coupling means effective when said voltage developed across said impedance element is less than said predetermined magnitude for presenting a compensating impedance to said coupling means to maintain the total impedance presented to said coupling means substantially constant.

6. In an amplifier, a transistor having an input impedance variable as a function of applied bias and having input and output electrodes and a common electrode, coupling means for applying input signals to said input electrode, said coupling means being connected to said input electrode whereby variations in said input impedance are presented to said coupling means, a source of automatic volume control bias variable according to the level of said input signals for variably biasing said input electrode, a resistor connected to said common electrode for developing a voltage varying in accordance with the bias impressed upon said input electrode whereby said input impedance is varied and the voltage developed across said resistor is correspondingly varied, a source of reference potential, a diode interconnected between said source of reference potential and the connection of said resistor and said common electrode for sensing when said voltage developed across said resistor is less than a predetermined magnitude, a capacitor connected between said coupling means and the junction of said diode and said source of reference potential, said capacitor and said diode presenting a compensating impedance to said coupling means when said voltage developed across said resistor is less than said predetermined magnitude to maintain the total impedance presented to said coupling means substantially constant.

References Cited in the file of this patent

UNITED STATES PATENTS

| | | |
|---|---|---|
| 2,167,400 | Farrington | July 25, 1939 |
| 2,273,639 | Haantjes | Feb. 17, 1942 |
| 2,434,929 | Holland et al. | Jan. 27, 1948 |
| 2,676,214 | Van Weel | Apr. 20, 1954 |
| 2,750,452 | Goodrich | June 12, 1956 |
| 2,757,243 | Thomas | July 31, 1956 |
| 2,759,111 | Wideroe | Aug. 14, 1956 |
| 2,774,866 | Burger | Dec. 18, 1956 |

FOREIGN PATENTS

| | | |
|---|---|---|
| 414,187 | Great Britain | Aug. 2, 1934 |

OTHER REFERENCES

Chow article, Proc. I.R.E., Sept. 1955, pages 1119–1127.